(12) United States Patent
Shibasaki

(10) Patent No.: US 6,223,815 B1
(45) Date of Patent: May 1, 2001

(54) COOLING UNIT FOR COOLING A HEAT-GENERATING COMPONENT AND ELECTRONIC APPARATUS HAVING THE COOLING UNIT

(75) Inventor: Kazuya Shibasaki, Hamura (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/520,782

(22) Filed: Mar. 8, 2000

(30) Foreign Application Priority Data

Mar. 19, 1999 (JP) .................................................. 11-074897

(51) Int. Cl.⁷ ................................. H05K 7/20; F28F 7/00
(52) U.S. Cl. ..................... 165/185; 165/80.3; 361/697; 361/703; 361/708
(58) Field of Search .................. 165/185, 80.3; 361/697, 703, 705, 708; 257/722; 174/16.3

(56) References Cited

U.S. PATENT DOCUMENTS

| | | | | |
|---|---|---|---|---|
| 4,765,400 | * | 8/1988 | Chu et al. ............................. | 165/185 |
| 4,800,956 | * | 1/1989 | Hamburgen ........................... | 165/185 |
| 5,595,240 | * | 1/1997 | Daikoku et al. ...................... | 165/185 |
| 5,623,394 | * | 4/1997 | Sherif et al. .......................... | 361/705 |
| 5,829,514 | * | 11/1998 | Smith et al. .......................... | 165/185 |
| 5,862,038 | * | 1/1999 | Suzuki et al. ........................ | 165/80.3 |
| 6,064,573 | * | 5/2000 | Morton .................................. | 165/185 |
| 6,093,961 | * | 7/2000 | McCullough ......................... | 257/718 |
| 6,134,783 | * | 10/2000 | Bargman et al. .................... | 165/80.3 |

FOREIGN PATENT DOCUMENTS 7-86471   3/1995   (JP) .

* cited by examiner

Primary Examiner—James C. Yeung
Assistant Examiner—Tho Duong
(74) Attorney, Agent, or Firm—Finnegan, Henderson, Farabow, Garrett & Dunner, L.L.P.

(57) ABSTRACT

A cooling unit having a first heat sink and a second heat sink. The first heat sink overlaps a heat-generating component. The second heat sink covers the first heat sink. The first heat sink having a plurality of heat-conducting sections extending away from the heat-generating component. The second heat sink has a plurality of heat-receiving sections, in which the heat-conducting sections are inserted. A first gap is provided between the first heat sink and the second heat sink. A second gap is provided between each heat-conducting section and the heat-receiving section in which the heat-conducting section is inserted. The first gap and the second gap are filled with grease having viscosity. The grease thermally connects the first heat sink and the second heat sink.

7 Claims, 6 Drawing Sheets

COOLING UNIT FOR COOLING A HEAT-GENERATING COMPONENT AND ELECTRONIC APPARATUS HAVING THE COOLING UNIT

CROSS-REFERENCE TO RELATED APPLICATION

This application is based upon and claims the benefit of priority from the prior Japanese Patent Application No. 11-074897, filed Mar. 19, 1999, the entire contents of which are incorporated herein by reference.

BACKGROUND OF THE INVENTION

The present invention relates to a cooling unit for facilitating the radiation of heat from a heat-generating component, e.g., a semiconductor package, and also relates to an electronic apparatus incorporating the cooling unit.

Electronic apparatuses, e.g., portable computers and workstations, have a CPU each. The CPU is designed to process multimedia information, such as characters, speech, sound, and images. The data-processing speed and the number of functions of the CPU have continuously increased. The higher the speed the CPU processes data and the more functions it performs, the more electric power it consumes. The amount of heat the MPU generates while operating increases in proportion to the power it consumes.

In order to guarantee a stable operation of the CPU, a heat-radiating, cooling module such as a heat sink is indispensable. This is because the cooling module can cool the CPU with high efficiency.

Conventional heat sinks have a heat-receiving section and a heat radiating section each. The heat-receiving section receives the heat generated by a CPU. The heat-radiating section radiates the heat transmitted to the heat-receiving section. Such a heat sink is secured by screws to the housing of an electronic apparatus or to the circuit board provided in the housing and having a CPU mounted thereon. Thus, the heat-receiving section of the heat sink is thermally connected to the CPU.

A semiconductor package for use as a CPU in portable computers is a BGA (Ball Grid Array) package in most cases. The BGA package has a wiring substrate made of synthetic resin and an IC chip mounted on the wring substrate and connected thereto by flip-chip method. When the BGA package is mounted on a circuit board, its height may vary by 0.25 mm at most. Since the heat sink is an injection molding made of aluminum, i.e., a metal excelling in thermal conductivity, its parts, including the heat-receiving section, need to have dimensional tolerances.

In view of this, a heat-conducting sheet is interposed between the IC chip and the heat-receiving section of the heat sink. The sheet is made of rubber that has high thermal conductivity. The heat-conducting sheet is clamped between the IC chip and the heat-receiving section and elastically deformed when the heat sink is secured to the circuit board or housing of the electronic apparatus. Thanks to the deformation of the sheet, the change in the height of the BGA package and the change in size of the heat sink are compensated for. As a result, the heat-receiving section and the IC chip can remain in a stable thermal connection.

This conventional thermal connection between the heat sink and the BGA package is, however, disadvantageous. When the heat sink is secured to the circuit board or housing of the electronic apparatus, its heat-receiving section is pressed directly onto the heat-conducting sheet and, hence, indirectly onto the IC chip of the BGA package. In other words, the force the screws apply, fastening the heat sink to the circuit board or housing of the electronic apparatus, act as a direct stress on the BGA package. If the BGA package is strong enough to overcome this stress, no problems will arise at all. In fact, the BGA package can hardly be said to withstand the stress since the IC chip is exposed outside the package and the wiring substrate supporting the IC chip is made of soft synthetic resin.

Thus, the stress concentrates on the IC chip once after the heat-receiving section of the heat sink is thermally connected to the IC chip of the BGA package. The IC chip may therefore be broken. Moreover, a load is imposed, pushing the IC chip to the wiring substrate. This load acts a bending stress on the wiring substrate, deflecting or warping the wiring substrate. Consequently, a stress keeps acting on the junction between the IC chip and the wiring substrate. This may results in an inadequate electrical connection between the IC chip and the wiring substrate.

Hence, the load that can be applied to the heat sink to thermally connect the heat-receiving section to a semiconductor package such as a BGA package is limited. That is, the heat-receiving section of the heat sink cannot be pressed with a large force onto the semiconductor package. High thermal resistance is likely to develop at the junction between the heat sink and the semiconductor package. Heat cannot be efficiently transmitted from the semiconductor package to the heat sink.

BRIEF SUMMARY OF THE INVENTION

The present invention has been made in consideration of the above. The object of the invention is to provide a cooling unit that can efficiently cool a heat-generating component by effectively transmitting heat from the component to two heat sinks, without applying a large stress on the heat-generating component.

To attain the first object, a cooling unit according to the first aspect of the invention comprises: a first heat sink overlapping a heat-generating component and thermally connected thereto, the first heat sink having a plurality of heat-conducting sections; and a second heat sink covering the first heat sink, having a plurality of heat-receiving sections with which the heat-conducting sections are set in engagement. The second heat sink is so positioned that a first gap is provided between the first heat sink and the second heat sink and a second gap is provided between each heat-receiving section and one heat-conducting section and communicating with the first gap. The first gap and the second gap are filled with a heat-conducting medium. The heat-conducting medium is semi-solid material having viscosity and thermally connecting the first heat sink and the second heat sink.

To achieve the object described above, an electronic apparatus according to the invention comprises: a housing; a circuit board provided in the housing; a heat-generating component mounted on the circuit board; a first heat sink overlapping the heat-generating component and thermally connected thereto and having a plurality of heat-conducting sections; and a second heat sink covering the first heat sink, having a plurality of heat-receiving sections with which the heat-conducting sections are set in engagement. The second heat sink being so positioned that a first gap is provided between the first heat sink and the second heat sink and a second gap is provided between each heat-receiving section and one heat-conducting section and communicating with the first gap. A heat-conducting medium is filled in the first gap and the second gap. The heat-conducting medium is semi-solid material having viscosity and thermally connecting the first heat sink and the second heat sink.

Since the heat-conducting sections of the first heat sink are engaged with the heat-receiving sections of the second heat sink, respectively, a great heat-conducting area is provided at the junction between the first heat sink and the second heat sink. In addition, since the gap between the first and second heat sinks is filled with the heat-conducting medium, the thermal resistance at the junction between the first and second heat sinks is low. As a result, the heat can be conducted from the first heat sink to the second heat sink with high efficiency. This enables the heat-generating component to radiate heat more efficiently.

Since the first and second heat sinks are spaced with the first and second gaps between them, not contacting each other, the first and second gaps compensate for the changes in size of the heat sinks and the heat-generating component. Moreover, even if the first and second gaps change in size and shape due to the change in size of the heat sinks, the heat-conducting medium filled in the gaps flows, keeping the first and second heat sinks spaced from each other. This is because the medium is a soft, semi-solid material and freely deforms when applied with an external force. Thus, once the second heat sink covers the first heat sink, an excessive stress would not be applied to push the first heat sink onto the heat-generating component. The heat-generating component therefore receives only the weight of the first heat sink. An excessive stress would not concentrate on the component, which is protected against damage.

To achieve the object described above, a cooling unit according to the invention comprises a first heat sink overlapping a heat-generating component, a second heat sink, a heat-conducting medium, and elastic bodies. The first heat sink has a plurality of heat-conducting sections. The second heat sink covers the first heat sink, has a plurality of heat-receiving sections with which the heat-conducting sections are set in engagement. The second heat sink is so positioned that a first gap is provided between the first heat sink and the second heat sink and a second gap is provided between each heat-receiving section and one heat-conducting section and communicating with the first gap. The second heat sink holds the first heat sink, allowing the first heat sink to move toward and away from the heat-generating component. The heat-conducting medium is filled in the first gap and the second gap. It is semi-solid material having viscosity and thermally connecting the first heat sink and the second heat sink. The elastic bodies are interposed between the first heat sink and the second heat sink. They can elastically deform and bias the first heat sink onto the heat-generating component.

In this structure, too, the heat-conducting sections of the first heat sink are engaged with the heat-receiving sections of the second heat sink, respectively. Therefore, a great heat-conducting area is provided at the junction between the first heat sinks and the second heat sink. In addition, since the gap between the first and second heat sinks is filled with the heat-conducting medium, the thermal resistance at the junction between the first and second heat sinks is low. Moreover, since the elastic bodies bias the first heat sink onto the heat-generating component, the first heat sink and the heat-generating component remains in stable thermal connection, and the thermal resistance at the junction between them is low. Thus, the two heat sinks can serve to radiate heat from the heat-generating component with high efficiency.

In addition, the first and second gaps compensate for the changes in size of the heat sinks and the heat-generating component. This is because the first and second heat sinks are spaced with the first and second gaps between them, not contacting each other. Moreover, even if the first and second gaps change in size and shape due to the change in size of the heat sinks, the heat-conducting medium filled in the gaps flows, keeping the first and second heat sinks spaced from each other. This is because the medium is a soft, semi-solid material and freely deforms when applied with an external force.

Thus, once the second heat sink covers the first heat sink, an excessive stress would not be applied to push the first heat sink onto the heat-generating component. The heat-generating component therefore receives only the weight of the first heat sink. An excessive stress would not concentrate on the component, which is protected against damage.

To attain the object mentioned above, a cooling unit according to this invention comprises a first heat sink, a second heat sink, and elastic bodies. The first heat sink overlaps a heat-generating component and is thermally connected thereto. The second heat sink is thermally connected to the first heat sink and holds the first heat sink, allowing the first heat sink to move toward and away from the heat-generating component. The elastic bodies are interposed between the first heat sink and the second heat sink and bias the first heat sink onto the heat-generating component.

To achieve the object described above, an electronic apparatus according to the invention comprises a housing, a heat-generating component provided in the housing, a first heat sink, a second heat sink, and elastic bodies. The first heat sink overlaps the heat-generating component and is thermally connected thereto. The second heat sink is thermally connected to the first heat sink and holds the first heat sink, allowing the first heat sink to move toward and away from the heat-generating component. The elastic bodies are interposed between the first heat sink and the second heat sink and bias the first heat sink onto the heat-generating component.

In this structure, the first heat sink and the heat-generating component remain in stable thermal connection because the elastic bodies bias the first heat sink onto the heat-generating component. As a result, the thermal resistance at the junction between the first heat sink and the heat-generating component is low. Thus, the two heat sinks can serve to radiate heat from the heat-generating component with high efficiency.

Since the first heat sink remains floating above the heat-generating component, it can move, thereby to compensate for changes, if any, in the size of the first heat sink and the heat-generating component.

Thus, once the first and second heat sinks have been thermally connected, an excessive stress would not be applied to push the first heat sink onto the heat-generating component. The heat-generating component therefore receives only the weight of the first heat sink. An excessive stress would not concentrate on the component, which is protected against damage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A portable computer, which is the first embodiment of this invention, will be described, with reference to FIGS. 1 to 3.

Figure 1:
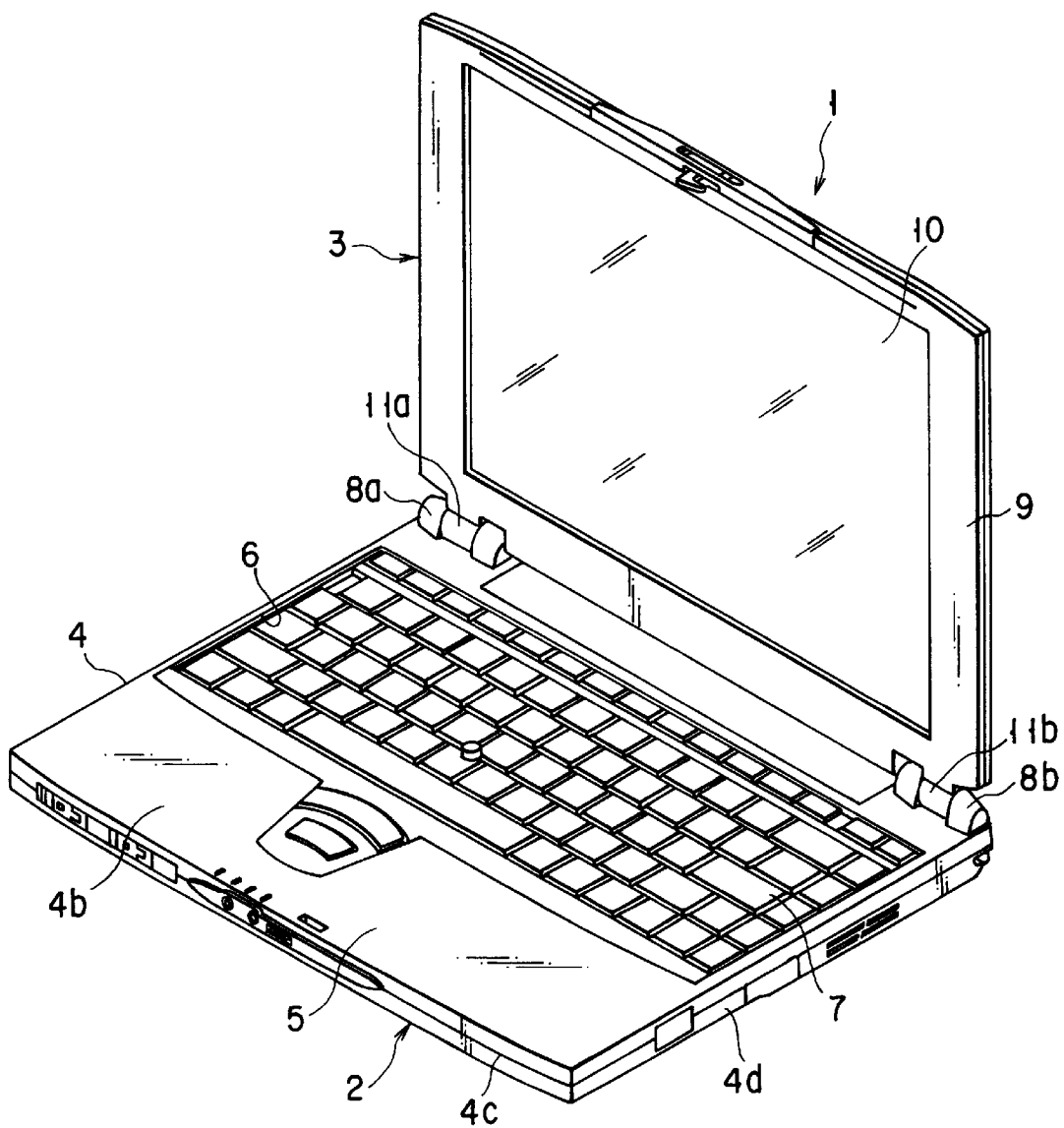
FIG. 1 is a perspective view of a portable computer that is the first embodiment of the present invention.

FIG. 1 shows the portable computer 1. The portable computer 1 comprises a main body 2 and a display unit 3 supported by the main body 2.

The man body 2 has a housing 4, which is shaped like a flat box. The housing 4 is made of metal having high thermal conductivity, such as magnesium alloy. The housing 4 comprises a bottom wall 4a, a top wall 4b, a front wall 4c, left and right side walls 4d, and a rear wall (not shown).

The top wall 4b of the housing 4 has a palm rest 5 and a keyboard recess 6. The palm rest 5 is rectangular, extending in the widthwise direction of the housing 4 and constituting the front half of the top wall 4b. The keyboard recess 6 is located at the back of the palm rest 5. The recess 6 holds a keyboard 7. The top wall 4b of the housing 4 has a pair of display supports 8a and 8b. The supports 8a and 8b extend upwards at the rear end of the top wall 4b and are spaced apart from each other in the widthwise direction of the housing 4.

The display unit 3 comprises a display housing 9 and a liquid crystal display 10. The display housing 9 is a flat box. The liquid crystal display 10 is set in the display housing 9. The display housing 9 has a pair of legs 11a and 11b. The legs 11a and 11b protrude downwards from the lower edge of the housing 9. The legs 11a and 11b are hinged to the display supports 8a and 8b, respectively, by means of hinge devices (not shown). The display unit 3 is thereby connected to the housing 4 and can be rotated. More specifically, the unit 3 can be rotated between a closed position and an opened position. In the closed position, the display unit 3 covers the palm rest 5 and keyboard 7 from above. In the opened position, the display unit 3 stands at the back of the keyboard 5, exposing the palm rest 5 and keyboard 7.

Figure 2:
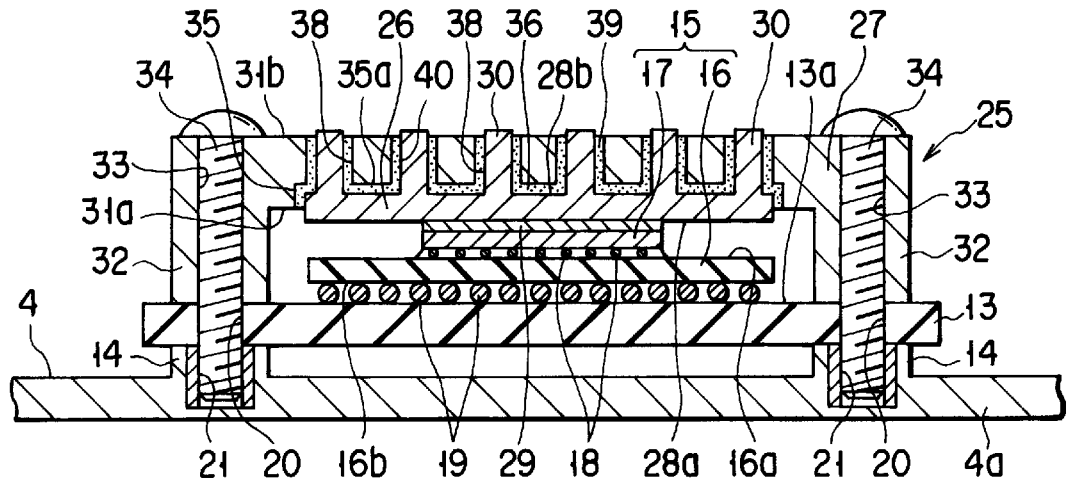
FIG. 2 is a sectional view showing the cooling unit incorporated in the portable computer shown in FIG. 1.
Figure 3:
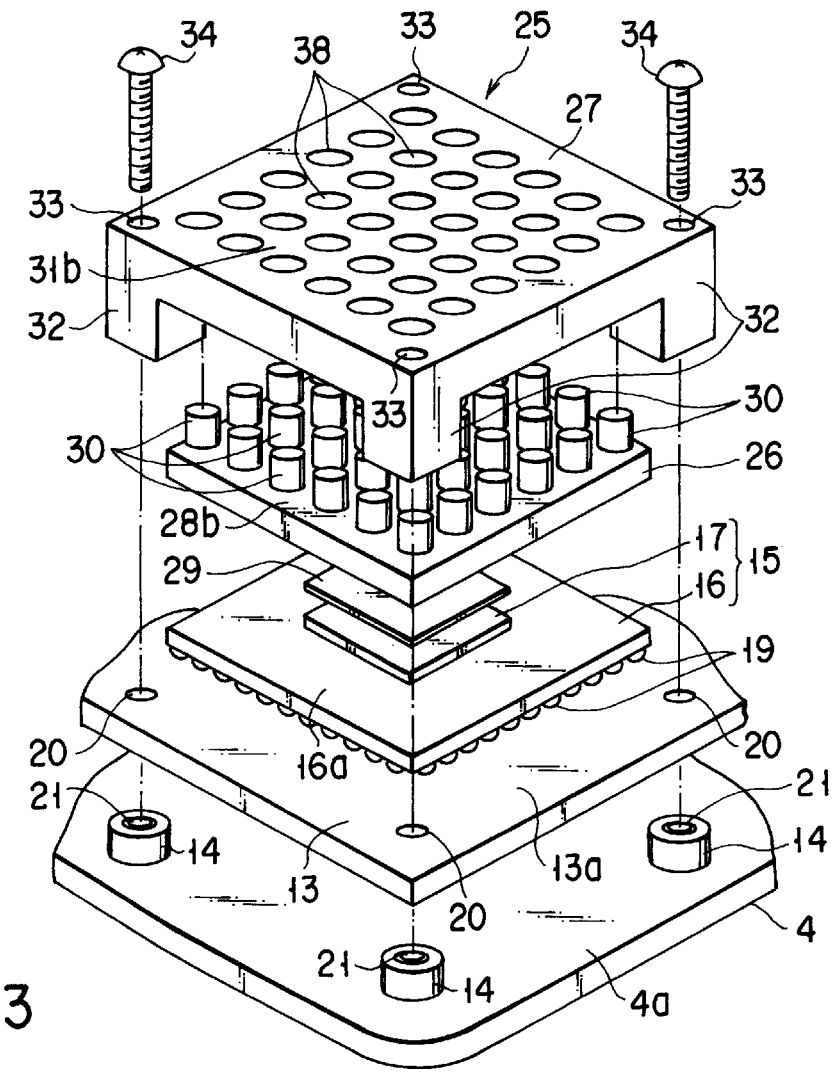
FIG. 3 is an exploded view, illustrating the positional relation between the cooling unit and the BGA package mounted on the circuit board provided in the computer.

As shown in FIGS. 2 and 3, the housing 4 contains a circuit board 13. The circuit board 13 is mounted on a plurality of seats 14 that protrude upwards from the bottom wall 4a of the housing 4. The circuit board 13 has a component-mounting surface 13a that faces away from the bottom wall 4a. On the component-mounting surface 13a, a BGA semiconductor package 15 is mounted. The BGA semiconductor package 15 is a component that inevitably generates heat while operating.

The semiconductor package 15 is rectangular, having four corners. The package 15 comprises a wiring substrate 16 and an IC chip 17. The wiring substrate 16 is made of synthetic resin and has two surfaces 16a and 16b. The IC chip 17 consumes much power, while operating to process multi-media information, such as characters, speech, sound, and images. While operating, the IC chip 17 generates so much heat that it needs to be cooled. The IC chip 17 is connected to the center part of the first surface 16a of the wiring substrate 16 by means of flip-chip connection, by using a number of solder balls 18. The second surface 16b of the wiring substrate 16 faces away from the IC chip 17.1 On the second surface 16b, a number of solder balls 19 are arranged in rows and columns, serving as power-supplying terminals. The solder balls 19 directly contact a pad (not shown) provided on the component-mounting surface 13a of the circuit board 13, thus electrically connecting the semiconductor package 15 to the circuit board 13.

The circuit board 13 has four through holes 20, which are positioned around the semiconductor package 15 and near the four corners of the semiconductor package 15. The holes 20 are axially aligned with the seats 14 that protrude upwards from the bottom wall 4a. The seats 14 have a screw hole 21 each. The screw holes 21 of the seats 14 communicate with the through holes 20 of the circuit board 13, respectively.

A heat sink assembly 25 is attached to the component-mounting surface 13a of the circuit board 13. The heat sink assembly 25 is provided to promote the radiation of heat from the semiconductor package 15. The assembly 25 comprises two heat sinks 26 and 27. Both heat sinks 26 and 27 are injection moldings made of metal excelling in thermal conductivity, such as an aluminum alloy.

The first heat sink 26 is a flat plate of almost the same size as the semiconductor package 15 and is placed thereon. The first heat sink 26 has a flat first surface 28a and a second surface 28b that faces away from the first surface 28a. The first surface 28a functions to receive heat. The center part of the first surface 28a opposes the IC chip 17. A heat-conducting sheet 29 is interposed between the first surface 28a and the IC chip 17. The sheet 29 is made of rubber-like elastic material that has high thermal conductivity. The heat-conducting sheet 29 leaves no space between the first surface 28a and the IC chip 17. The sheet 29 therefore thermally connects the IC chip 17 to the first heat sink 26.

A number of columnar projections 30 stand on the second surface 28b of the first heat sink 26, extend upwards therefrom and are arranged in rows and columns thereon. The projections 30 work as heat-conducting sections. They protrude away from the semiconductor package 15 and are made integral with the first heat sink 26.

The second heat sink 27 covers that surface of the first heat sink 26 that faces away from the semiconductor package 15. The second heat sink 27 is a flat plate and have a size larger than the first heat sink 26. The second heat sink 27 has a flat first surface 31a and a second surface 31b that faces away from the first surface 31a.

The second heat sink 27 has four corners that extend outwards a longer distance than the sides of the first heat sink 26. Four legs 32 are formed integral with the corners of the second heat sink 27. The legs 32 extend downwards from the second heat sink 27. The legs 32 abut, at their distal ends, on the component-mounting surface 13a of the circuit board 13. Each leg 32 has a through hole 33, which opens at the distal end of the leg 32 and which opens to the second surface 31b of the second heat sink 27.

Four screws 34 (only two sown in FIG. 3) pass through the holes 33 of the legs 32, from the second surface 31b of the second heat sink 27. The screws 34 have their distal end portions driven into the screw holes 21 of the seats 14. The legs 32 and the circuit board 13 are thereby secured to the bottom wall 4a of the housing 4. As a result, the circuit board 13 and the second heat sink 27 are positioned as desired with respect to each other.

Once the second heat sink 27 has been fixed to the housing 4 as is illustrated in FIG. 2, the first surface 31a of the second heat sink 27 opposes the first heat sink 26. The first surface 31a has a recess 35. It is in the recess 35 that the first heat sink 26 lies in part. The recess 35 has a flat bottom 35a, which faces the second surface 28b of the first heat sink 26. A first gap 36 is provided between the bottom 35a of the recess 35 and the second surface 28b of the first heat sink 26.

The second heat sink 27 has a number of through holes 38 that axially align with the projections 30. The holes 38 function as heat-receiving sections. The holes 38 have a circular cross section and are arranged in rows and columns. Each hole 38 opens at one end to the bottom 35a of the second heat sink 27 and at the other end to the second surface 31b of the second heat sink 27. The through holes 38 have a diameter larger than that of the projections 30. The projections 30 are loosely inserted in the holes 38, providing a second gap 39 between the inner surface of each hole 38 and the circumferential surface of the projection 30 inserted in the hole 38. The second gap 39 communicates with the first gap 36 described above.

Both the first gap 36 and the second gap 39 are filled with grease 40 that function as a heat-conducting medium. The grease 40 is a semi-solid material that excels in thermal conductivity. It has an appropriate viscosity and such fluidity that it freely deforms when applied with an external force. The grease 40 achieves thermal connection between the first heat sink 26 and the second heat sink 27.

In the portable computer having the structure described above, the IC chip 17 of the semiconductor package 15 generates heat while operating. The heat is conducted from the IC chip 17 to the first heat sink 26 via the heat-conducting sheet 29, and thence to the second heat sink 27 via the grease 40. The heat radiates from the second heat sink 27 into the atmosphere from, by virtue of natural air-cooling.

As indicated above, the projections 30 of the first heat sink 26 are inserted in the through holes 38 of the second heat sink 27. Thus, a great heat-conducting area is provided at the junction between the heat sinks 26 and 27. In addition, the first gaps 36 and second gaps 39, each existing between the heat sinks 26 and 27, are filled with the grease 40 having high thermal conductivity. The thermal resistance at the junction between the heat sinks 26 and 27 is therefore low.

Hence, heat can be efficiently conducted between the first heat sink 26 and the second heat sink 27. The heat sinks 26 and 27 therefore cooperate to radiate, with high efficiency, the heat generated by the semiconductor package 15.

The first heat sink 26 and the second heat sink 27 do not contact each other; they are spaced apart by the first gaps 36 and second gaps 39. The gaps 36 and 39 compensate for changes, if any, in the height and size of the heat sinks 26 and 27. Moreover, even if the gaps 36 and 39 change in size and shape, the grease 40 filled in the gaps 36 and 39 flows, keeping the heat sinks 26 and 27 spaced from each other. This is because the grease 40 is a soft, semi-solid material and freely deforms when applied with an external force.

Furthermore, thanks to the grease 40, no stress is applied to the first heat sink 26 when the second heat sink 27 is secured to the housing 4 with the screws 34. The semiconductor package 15 receives only the weight of the first heat sink 26. An excessive stress would not concentrate on the IC chip 17 of the semiconductor package 15. The solder balls 18 and 19 are prevented from being broken, and the wiring substrate 16 and circuit board 13 are prevented from deflecting or warping. Hence, the junctions between the solder balls 18 and the wiring substrate 16 will not be damaged. Nor will the junctions between the solder balls 19 and the circuit board 13 be damaged. The semiconductor package 15 therefore remains in reliable electrical connection.

The present invention is not limited to the first embodiment described above. The second embodiment of the invention will be described, with reference to FIG. 4.

The second embodiment differs from the first embodiment in the structure of the second heat sink 27. In all other respects, the second embodiment is identical to the first embodiment.

Figure 4:
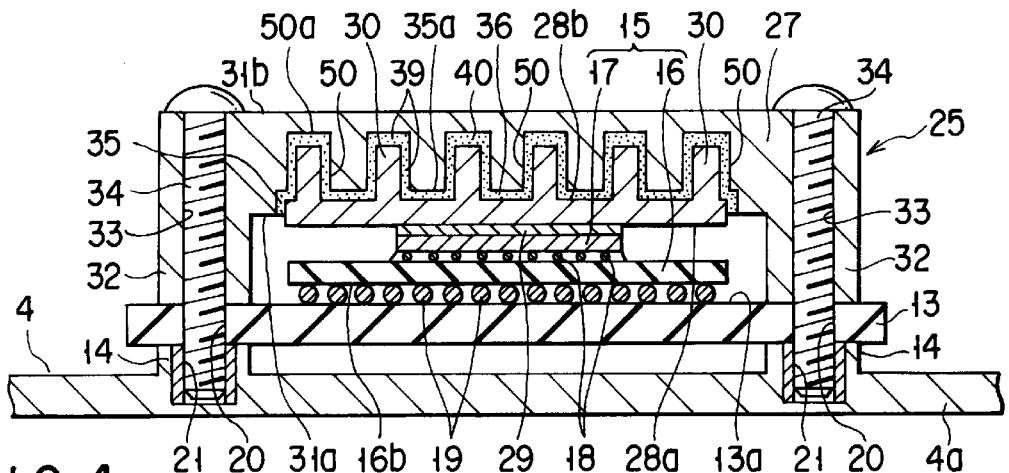
FIG. 4 is a sectional view of a cooling unit according to the second embodiment of the invention.

As shown in FIG. 4, the second heat sink 27 has a number of holes 50 in the second embodiment. These holes 50 function as heat-receiving sections. The holes 50 are arranged in rows and columns. The columnar projections 30 of the first heat sink 26 are inserted in the holes 50 of the second heat sink 27. The holes 50 opens, at only one end, to the bottom 35a of the recess 35 made in the second heat sink 27. The holes 50 have a bottom 50a each, which is adjacent to the second surface 31b of the second heat sink 27. The bottoms 50a oppose the distal ends of the projections 30, respectively. A second gap 39 is provided between each hole 50 and the projection 30 inserted in the hole 50. The gap 39 is filled with grease 40.

In the second embodiment, the distal end of each projection 30 faces the bottom 50a of the hole 50 in which the projection 30 is inserted. Hence, a greater heat-conducting area is provided at the junction between the heat sinks 26 and 27 than in the first embodiment. The thermal resistance at the junction between the heat sinks 26 and 27 is therefore lower than in the first embodiment. As a result, heat can be conducted from the first heat sink 26 to the second heat sink 27 more efficiently than in the first embodiment.

Figure 5:
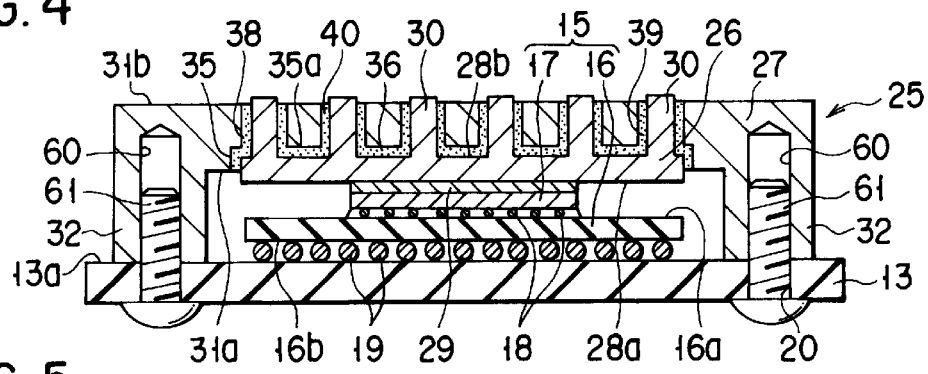
FIG. 5 is a sectional view of a cooling unit according to the third embodiment of this invention.
Figure 6:
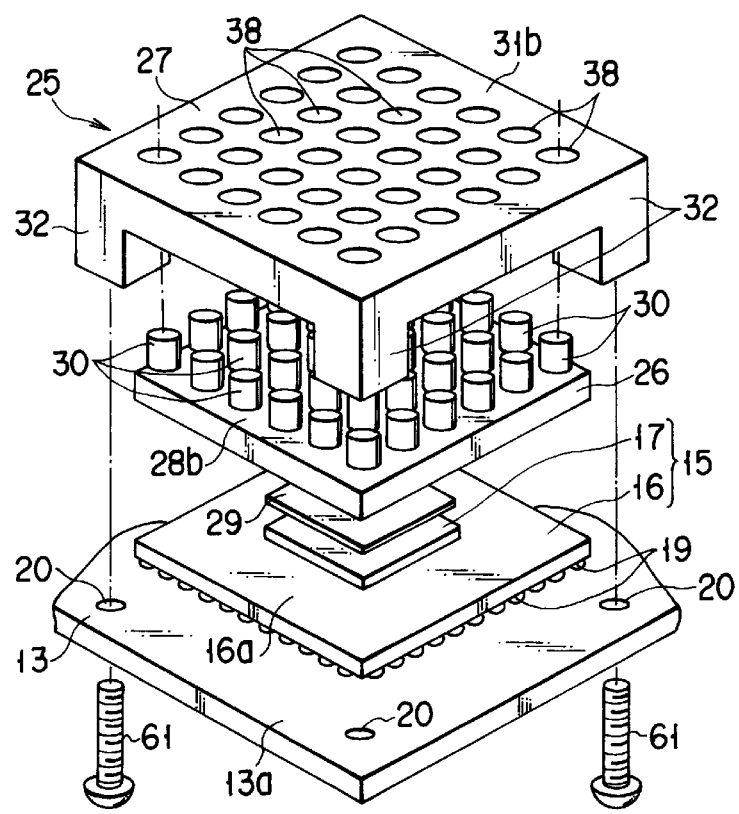
FIG. 6 is an exploded view, depicting the positional relation between the cooling unit of FIG. 5 and the BGA package mounted on a circuit board.

The third embodiment of the present invention will be described, with reference to FIGS. 5 and 6.

The third embodiment is different from the first embodiment in that the heat sink assembly 25 is secured directly to the circuit board 13. As shown in FIG. 5, the four legs 32 of the second heat sink 27 have a screw hole 60 each. The screw hole 60 is made in the distal end of the leg 32. Once after the legs 32 have abutted the component-mounting surface 13a of the circuit board 13, at their distal end, the screw holes 60 remain in axial alignment with the through holes 20 of the circuit board 13, respectively.

Four screws 61 extend through the through holes 20 of the circuit board 13, respectively, from the lower surface of the circuit board 13. The screws 61 are driven into the screw holes 60 that are made in the distal ends of the legs 32. The legs 32 are thereby fastened to the circuit board 13. The second heat sink 27 is thereby positioned with respect to the circuit board 13.

In the third embodiment thus constructed, the second heat sink 27 is separated from the housing 4. Hence, no restriction is imposed on the position the heat sink assembly 25 may take in the housing 4. That is, the freedom of placing the assembly 25 within the housing 4 increases.

The fourth embodiment of this invention will be described, with reference to FIGS. 7 and 8.

The fourth embodiment is different from the first embodiment in that the first heat sink 26 is resiliently pushed onto the semiconductor package 15. In any other respect, the fourth embodiment is identical to the first embodiment.

Figure 7:
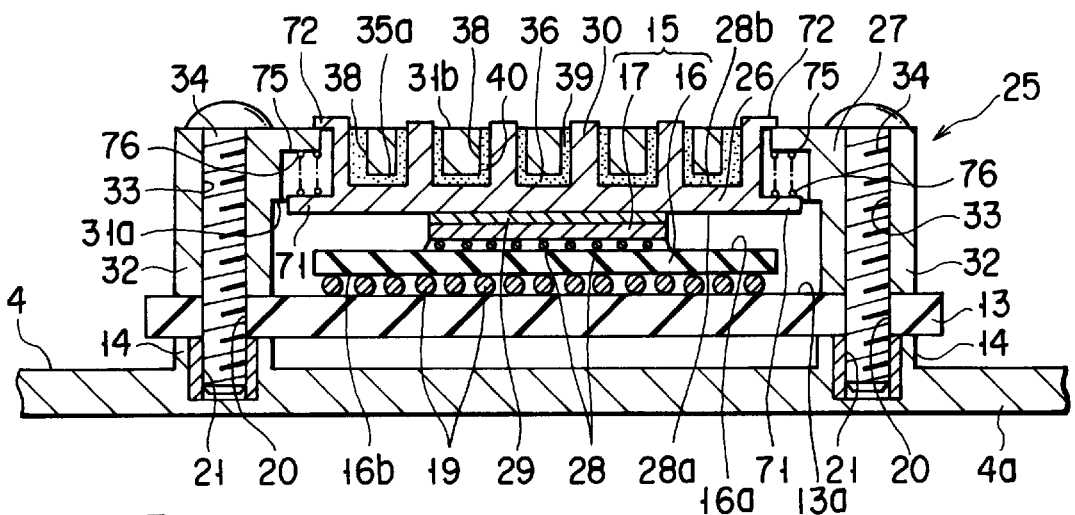
FIG. 7 is a sectional view of a cooling unit according to the fourth embodiment of the present invention.
Figure 8:
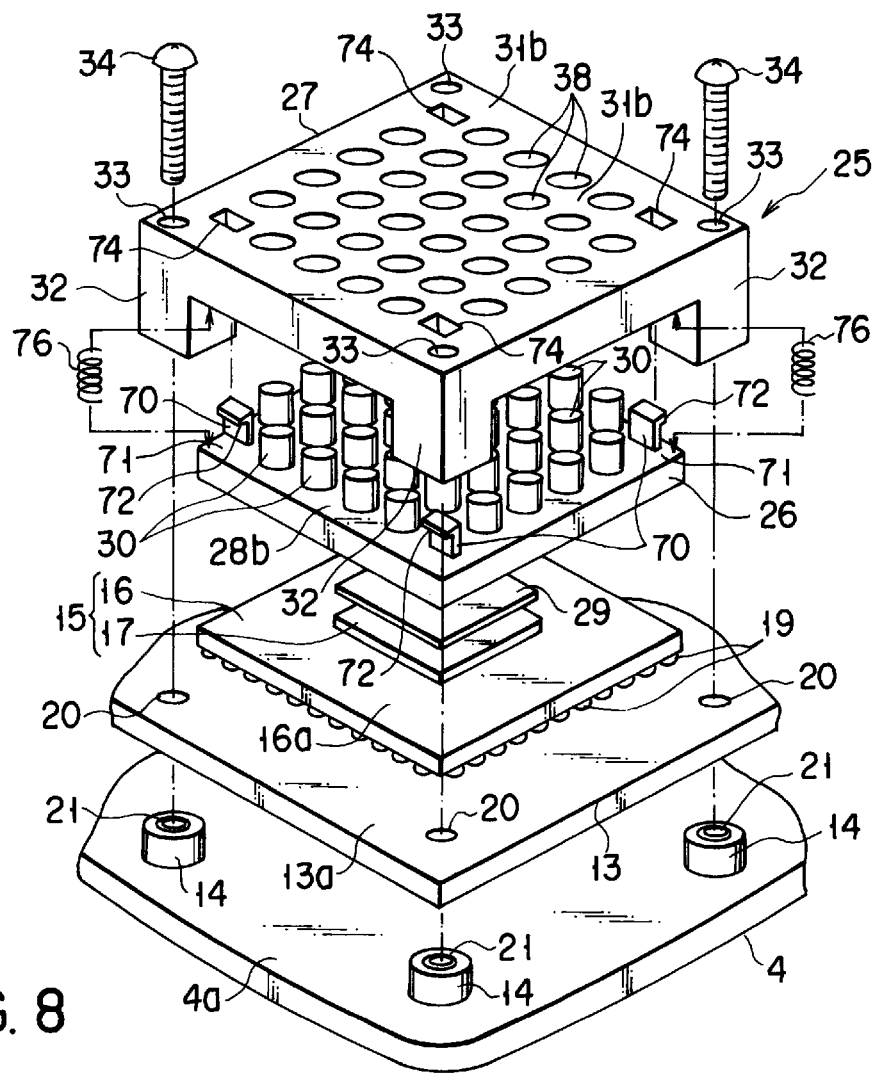
FIG. 8 is an exploded view, showing the positional relation between the cooling unit of FIG. 7 and the BGA package mounted on a circuit board.

As illustrated in FIGS. 7 and 8, the first heat sink 26 has four engagement projections 70 and a pair of first seat sections 71. The projections 70 are formed integral with the first heat sink 26. They protrude from the corners of the second surface 28b of the first heat sink 26, away from the semiconductor package 15. Each engagement projection 70 has a claw 72 at the distal end. The seat sections 71 are two diagonally opposing corners of the first heat sink 26 and located adjacent to the engagement projections 70, respectively.

The second heat sink 27 has four engagement holes 74 and a pair of second seat sections 75. The engagement holes 74 are axially aligned with the engagement projections 70 described above. They open at one to the second surface 31b of the second heat sink 27 and at the other end to the bottom 35a of the recess 35. The projections 70 are inserted in the engagement holes 74 from the recess 35. The claw 72 of each engagement projection 70 extends through one engagement hole 74 and latches on the second surface 31b of the second heat sink 27. The first heat sink 26 and the second heat sink 27 are thereby coupled with each other.

A first gap 36 exists between the second surface 28b of the first heat sink 26 and the bottom 35a of the recess 35 made in the second heat sink 27. Hence, the second heat sink 27 supports the first heat sink 26, allowing the first heat sink 26 to move toward and away from the semiconductor package 15 by the distance equal to the first gap 36.

The second seat sections 75 have been formed by depressing parts of the bottom 35a of the recess 35. The second seat sections 75 oppose the first seat sections 71 of the first heat sink 26. Compression coil springs 76 are interposed between the first seat sections 71, on the one hand, and the second seat sections 72, on the other. The coil springs 76, which serve as elastic bodies, always bias the first heat sink 26 onto the semiconductor package 15. The heat-conducting sheet 29 is therefore clamped between the first surface 28a of the first heat sink 26 and the IC chip 17. The heat-conducting sheet 29, first heat sink 26 and IC chip 17 are tightly put together.

The compression coil springs 76 bias the first heat sink 26 away from the second heat sink 27. The first heat sink 26 has engagement projections 70, which extend through the engagement holes 74 of the second heat sink 27. Thus, when the claws 72 on the projections 70 latch on the second surface 31b of the second heat sink 27 when the heat sink assembly 25 is removed from the circuit board 13. This prevents the first heat sink 26 from falling from the second heat sink 27. It is therefore easy to handle the heat sink assembly 25.

In the fourth embodiment, the compression coil springs 76 bias the first heat sink 26 onto the semiconductor package 15. The first heat sink 26 and the IC chip 17 therefore remain in stable thermal connection. The thermal resistance at the junction between the first heat sink 26 and the IC chip 17 decreases. Thus, the heat the IC chip 17 has generated can be conducted to the first heat sink 26 with high efficiency.

In the fourth embodiment, the first and second gaps 36 and 39 compensate for changes, if any, in the size of the heat sinks 26 and 27 and in the height of the semiconductor package 15. Further, even if the gaps 36 and 39 change in size and shape, the grease 40 filled in the gaps 36 and 39 flows and the compression coil springs 76 expand and contract. Hence, when the second heat sink 27 is fastened to the housing 4 by the screws 34, the fastening force the screws 34 exert would not be applied to the first heat sink 26. The semiconductor package 15 receives only the weight of the first heat sink 26. An excessive stress would not concentrate on the IC chip 17 of the semiconductor package 15.

The engagement projections 70 are not limited to those that are formed integral with the first heat sink 26. Rather, the projections 70 may be members made independently of the first heat sink 26. Moreover, the projections 70 may be made of synthetic resin that undergoes elastic deformation. If this is the case, the projections 70 will deflect when inserted into the engagement holes 74. This enables the claws 72 to easily latch on the second surface 31b of the second heat sink 27.

The fifth embodiment of the present invention will be described, with reference to FIGS. 9 and 10.

The fifth embodiment differs from the first embodiment in the structures of the first and second heat sinks 26 and 27. In any other respect, the fifth embodiment is identical in structure to the first embodiment.

Figure 9:
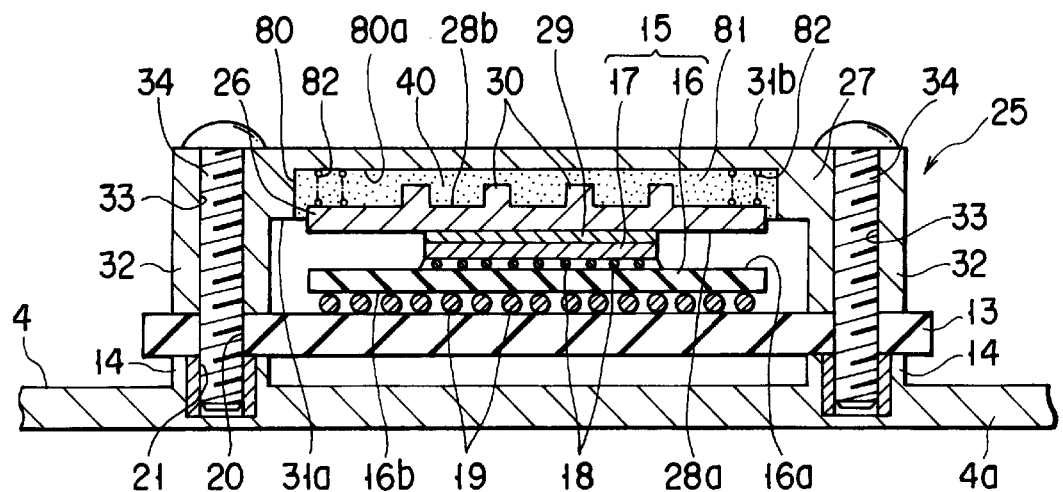
FIG. 9 is a sectional view of a cooling unit according to the fifth embodiment of the invention.
Figure 10:
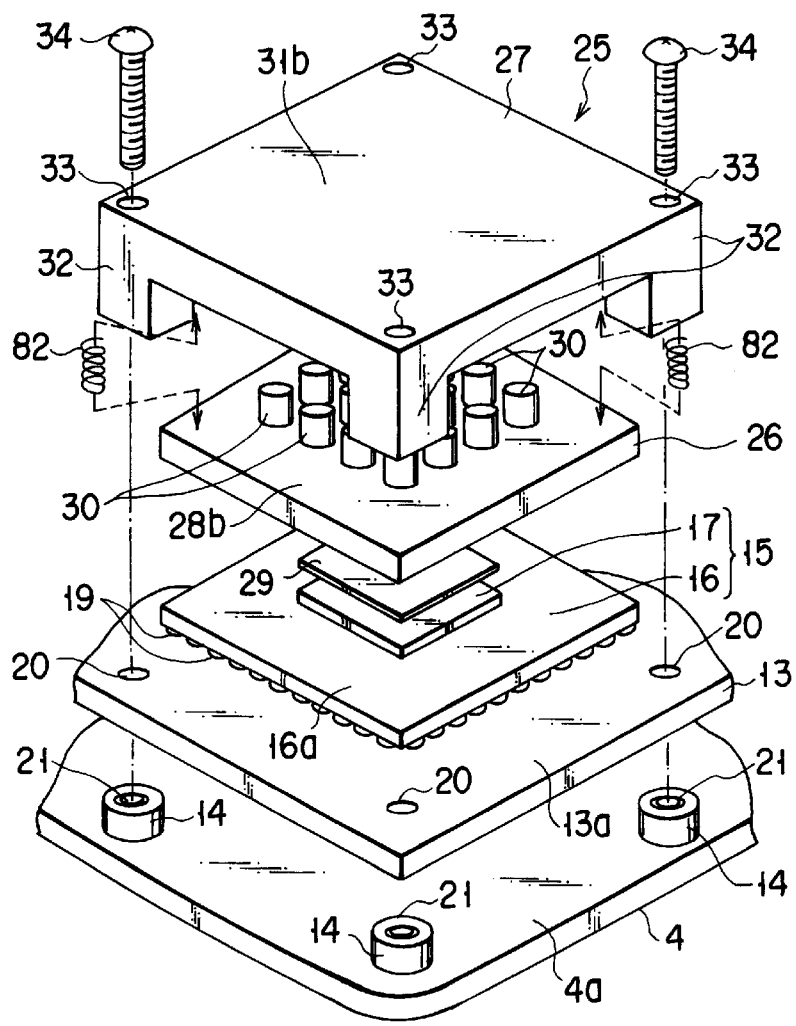
FIG. 10 is an exploded view, showing the positional relation between the cooling unit of FIG. 9 and the BGA package mounted on a circuit board.

As FIGS. 9 and 10 show, the first heat sink 26 has projections 30 that are arranged, densely on the center part of the second surface 28a of the first heat sink 26. The second heat sink 27 has a recess 80 in the center of the first surface 31a The recess 80 is larger than the first heat sink 26. The recess 80 opposes the second surface 28b and projections 30 of the first heat sink 26 once the second heat sink 27 has been secured to the housing 4. The projections 30 are inserted in the recess 80.

The recess 80 has a flat bottom 80a. The bottom 80a faces the distal ends of the projections 30 and the second surface 28b of the first heat sink 26. A gap 81 is provided between the bottom 80a, on the one hand, and the distal ends of the projections 30 and the second surface 28b of the first heat sink 26, on the other hand. A pair of compression coil springs 82 are interposed between the bottom 80a of the recess 80 and the second surface 28a of the first heat sink 26. The coil springs 82, which serve as elastic bodies, are arranged at the diagonally opposing corners of the first heat sink 26. The springs 82 bias the first heat sink 26, pushing the same onto the semiconductor package 15. The heat-conducting sheet 29 is therefore clamped between the first surface 28a of the first heat sink 26 and the IC chip 17. The heat-conducting sheet 29, first heat sink 26 and IC chip 17 are tightly put together.

The first heat sink 26 closes the recess 80. The gap 81 between the recess 80 and the first heat sink 26 is filled with grease 40, which functions as a heat-conducting medium. The grease 40 contacts the inner surfaces of the recess 80 and the second surface 28b of the first heat sink 26. The grease 40 covers and surrounds the projections 30. The grease 40 achieves thermal connection between the first heat sink 26 and the second heat sink 27.

In the fifth embodiment, the compression coil springs 82 keeps pushing the first heat sink 26 onto the semiconductor package 15. The first heat sink 26 therefore remains in stable thermal connection with the IC chip 17. It follows that the thermal resistance at the junction between the heat sink 26 and the IC chip 17 is low. Hence, heat can be efficiently conducted from the IC chip 17 to the first heat sink 26.

Further, since the grease 40 thermally connects the first and second heat sinks 26 and 27, the heat generated by the IC chip 17 and conducted to the first heat sink 26 is transmitted via the grease 40 to the second heat sink 27. Thus, the thermal resistance at the junction between the first and second heat sinks 26 and 27 decreases.

In addition, the gap 81 compensates for changes, if any, in the size of the heat sinks 26 and 27 and in the height of the semiconductor package 15. Further, even if the gap 81 changes in size and shape, the grease 40 filled in the gap 81 flows and the compression coil springs 82 expand and contract. Hence, when the second heat sink 27 is fastened to the housing 4 by the screws 34, the fastening force the screws 34 exert would not be applied to the first heat sink 26. The semiconductor package 15 receives only the weight of the first heat sink 26. An excessive stress would not concentrate on the IC chip 17 of the semiconductor package 15.

In the fifth embodiment, the first heat sink 26 may have no recess 30 at all. That is, the first heat sink 26 may be a flat plate.

The sixth embodiment of this invention will now be described, with reference to FIGS. 11 and 12.

The sixth embodiment differs from the second embodiment in the structures of the heat-conducting section of the first heat sink and the structure of the heat-receiving section of the second heat sink. In any other respect, the sixth embodiment is identical in structure to the second embodiment.

Figure 11:
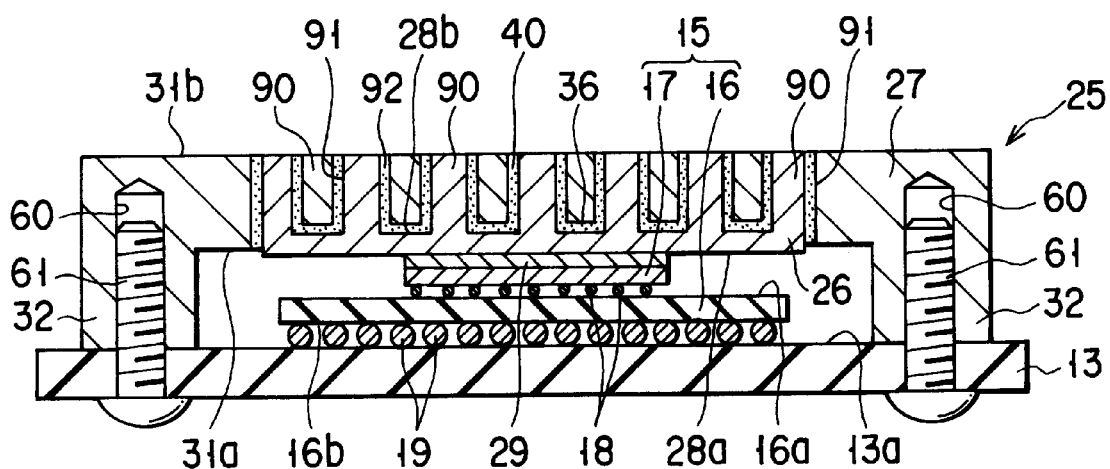
FIG. 11 is a sectional view of a cooling unit according to the sixth embodiment of this invention.
Figure 12:
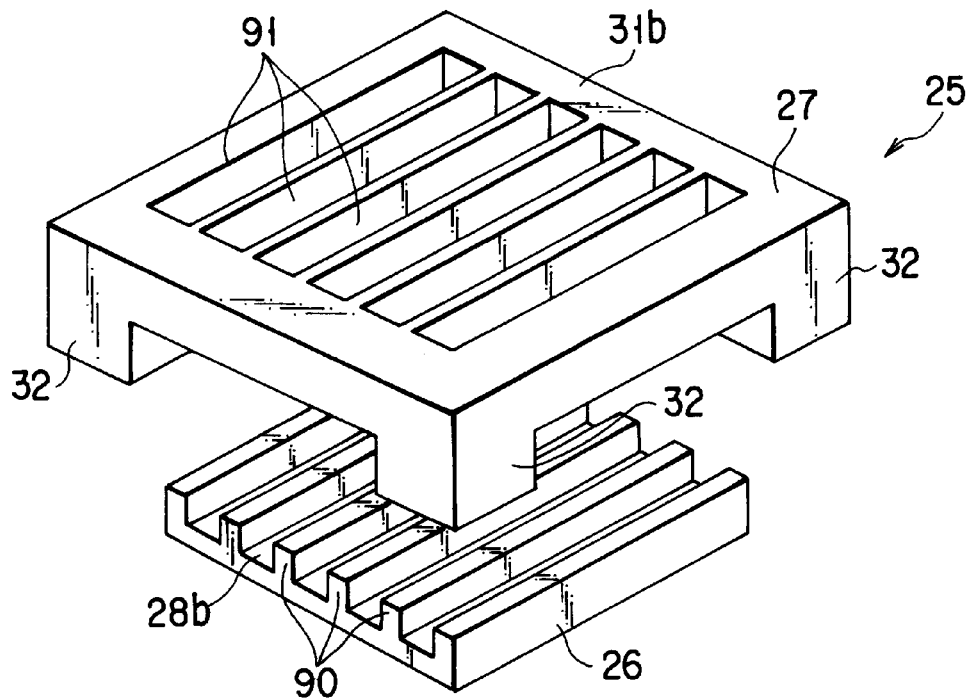
FIG. 12 is a perspective view of a cooling unit according to the sixth embodiment of the invention.

As shown in FIGS. 11 and 12, a plurality of low walls 90 stand on the second surface 28b of the first heat sink 26. The walls 90 function as heat-conducting sections. They horizontally extend in parallel to one another. They protrude upwards, away from the semiconductor package 15 and are formed integral with the first heat sink 26.

The second heat sink 27 has slits 91 that are vertically aligned with the walls 90 of the first heat sink 26. The slits 91 function as heat-receiving sections. The slits 91 horizontally extend in parallel to one another; they are spaced apart from one another. The walls 90 of the first heat sink 26 are inserted in the slits 91 of the second heat sink 27, with a second gap 92 provided between the inner surfaces of each slit 91 and the wall 90 inserted in the slit 91. The second gaps 92 communicate with the first gap 36 described above. The first gap 36 and the second gaps 92 are filled with grease 40.

In the sixth embodiment, a great heat-conducting area is provided at the junction between the heat sinks 26 and 27, because the walls 90 of the first heat sink 26 are inserted in the slits 91 of the second heat sink 27. It is therefore possible to conduct heat efficiently from the first heat sink 26 to the second heat sink 27. Heat can radiate from the IC chip 17 with high efficiency.

The present invention is not limited to the embodiments described above. Various changes and modification can be made, without departing from the spirit and scope of the invention.

For example, the heat-conducting section of the first heat sink is not limited to columnar projection or low walls. The heat-conducting section may be defined by either grooves or holes. In this case, the heat-receiving section of the second heat sink should be productions that are inserted in the grooves or holes, each with a gap between it and the groove or hole receiving it.

In the fourth and fifth embodiments described above, the elastic bodies that bias the first heat sink are compression coil springs. The elastic bodies are not limited to compression coil springs. A rubber member may be used in place of the coil springs. If this is the case, it is desired that the rubber member be a rectangular frame that is aligned with the peripheral edge of the first heat sink. Then, the rubber member can be easily interposed between the first heat sink and the second heat sink. Thus, it is easy to provide the heat sink assembly.

Furthermore, the heat-conducting medium that thermally connects the first and second heat sinks and may be paste, not grease, if the paste has appropriate viscosity and fluidity.

Moreover, the second heat sink need not be secured to the circuit board as in the embodiments described above. Rather, the second heat sink may be fastened to the bottom wall of the housing or a member, such as a frame, provided in the housing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cooling unit for cooling a heat-generating component, comprising:

a first heat sink overlapping the heat-generating component and thermally connected thereto, said first heat sink having a plurality of projections, each projection extending away from the heat-generating component and having a distal end remote from the heat-generating component;

a second heat sink covering the first heat sink, having a plurality of through holes in which the projections are inserted, each projection extending through a corresponding through hole and having the distal end protruding outward from the second heat sink, said second heat sink being so positioned that a first gap is provided between the first heat sink and the second heat sink and a second gap is provided between each projection and the corresponding through hole receiving the projection and communicating with the first gap; and a heat-conducting medium filled in the first gap and the second gap, being semi-solid material having a viscosity and thermally connecting the first heat sink and the second heat sink.

2. A cooling unit according to claim 1, further comprising a heat-conducting sheet interposed between the first heat sink and the heat-generating component and thermally connecting the heat-generating component and the first heat sink.

3. A cooling unit according to claim 1, wherein the heat-generating component is mounted on a circuit board, and the second heat sink is fastened to the circuit board by screws.

4. A cooling unit according to claim 1, wherein the heat-conducting medium is grease.

5. A cooling unit according to claim 3, wherein the heat-generating component is a semiconductor package including a substrate made of synthetic resin and two opposing surfaces, a plurality of power-supplying terminals provided on one of the opposing surfaces and an IC chip generating heat while operating, provided on the other of the opposing surfaces and electrically connected to the power-supplying terminals, the power-supplying terminals are soldered to the circuit board, and the IC chip is thermally connected to the first heat sink.

6. An electronic apparatus comprising:

a housing;

a circuit board provided in the housing;

a heat-generating component mounted on the circuit board;

a first heat sink overlapping the heat-generating component and thermally connected thereto, said first heat sink having a plurality of projections, each projection extending away from the heat-generating component and having a distal end remote from the heat-generating component;

a second heat sink covering the first heat sink, having a plurality of through holes in which the projections are inserted, each projection extending through a corresponding through hole and having the distal end protruding outward from the second heat sink, said second heat sink being so positioned that a first gap is provided between the first heat sink and the second heat sink and a second gap is provided between each projection and the corresponding through hole receiving the projection and communicating with the first gap; and a heat-conducting medium filled in the first gap and the second gap, being semi-solid material having a viscosity and thermally connecting the first heat sink and the second heat sink.

7. An electronic apparatus according to claim 6, wherein the second heat sink is fastened to the circuit board by screws.

* * * * *